(12) United States Patent
Kasabo et al.

(10) Patent No.: US 7,695,803 B2
(45) Date of Patent: Apr. 13, 2010

(54) SHEET MATERIAL FOR RADIO WAVE ABSORBER AND RADIO WAVE ABSORBER

(75) Inventors: Miki Kasabo, Kusatsu (JP); Kenichi Hatakeyama, Himeji (JP); Yoichi Fujimura, Otsu (JP)

(73) Assignee: Toray Industries, Inc., Tokyo (JP)

( * ) Notice: Subject to any disclaimer, the term of this patent is extended or adjusted under 35 U.S.C. 154(b) by 1043 days.

(21) Appl. No.: 10/540,622

(22) PCT Filed: Dec. 22, 2003

(86) PCT No.: PCT/JP03/16452

§ 371 (c)(1),
(2), (4) Date: Jun. 24, 2005

(87) PCT Pub. No.: WO2004/060037

PCT Pub. Date: Jul. 15, 2004

(65) Prior Publication Data

US 2006/0246261 A1 Nov. 2, 2006

(30) Foreign Application Priority Data

Dec. 25, 2002 (JP) ............................. 2002-374272
Jun. 26, 2003 (JP) ............................. 2003-183026

(51) Int. Cl.
*B29D 22/00* (2006.01)
*B32B 3/28* (2006.01)
*B65D 85/86* (2006.01)
*H01Q 17/00* (2006.01)

(52) U.S. Cl. ............... 428/182; 428/34.2; 428/34.5; 428/36.4; 342/1; 342/4; 206/719; 206/721

(58) Field of Classification Search ............... 428/34.2, 428/34.5, 36.3, 36.4, 172, 182; 342/1, 4; 206/719, 721

See application file for complete search history.

(56) References Cited

U.S. PATENT DOCUMENTS

| | | | | |
|---|---|---|---|---|
| 4,347,104 A | * | 8/1982 | Dressler | 162/103 |
| 4,606,790 A | | 8/1986 | Youngs et al. | 162/125 |
| 4,684,020 A | | 8/1987 | Ohlbach | 206/328 |
| 4,909,901 A | | 3/1990 | McAllister et al. | 162/125 |
| 5,310,593 A | * | 5/1994 | Tsujimoto et al. | 428/166 |
| 5,407,714 A | | 4/1995 | Laves | 428/34.2 |

(Continued)

FOREIGN PATENT DOCUMENTS

EP 1 022 805 A2 7/2000

(Continued)

*Primary Examiner*—Donald Loney
(74) *Attorney, Agent, or Firm*—Kubovcik & Kubovcik

(57) ABSTRACT

A sheet material for a radio wave absorber and a radio wave absorber formed from the sheet material, where the sheet material is light weighted and has excellent form-retaining capability and workability for field assembling. A sheet material (1) for a radio wave absorber has a corrugated paperboard structure with an undulated corrugated medium (2) and a planar liner (3) that are layered over each other. The corrugated medium (2) and/or the liner (3) are constructed from a sheet including an electrical-loss material. A radio wave absorber (10) is characterized in that the sheet material (1) for a radio wave absorber is cut, folded, and assembled as a hollow three-dimensional structure body, which has a shape of wedge, polygonal pyramid, or polygonal cylinder.

16 Claims, 12 Drawing Sheets

U.S. PATENT DOCUMENTS

| | | | | |
|---|---|---|---|---|
| 5,637,377 A | 6/1997 | Vermillion | ............. | 428/182 |
| 5,710,564 A | 1/1998 | Nimtz et al. | ............. | 342/1 |
| 5,736,009 A * | 4/1998 | Soon-Jai | ............. | 162/138 |
| 6,061,011 A * | 5/2000 | Yamamoto et al. | ............. | 342/1 |
| 6,407,693 B1 * | 6/2002 | Murase et al. | ............. | 342/4 |

FOREIGN PATENT DOCUMENTS

| | | | |
|---|---|---|---|
| JP | 59-78693 U | | 5/1984 |
| JP | 59-140825 U | | 9/1984 |
| JP | 61-183637 U | | 11/1986 |
| JP | 63-57797 U | | 4/1988 |
| JP | 2-253699 A | | 10/1990 |
| JP | 3-35597 A | | 2/1991 |
| JP | 4-79300 A | | 3/1992 |
| JP | 6-69676 A | | 3/1994 |
| JP | 07-251004 | * | 3/1995 |
| JP | 8-67544 A | | 3/1996 |
| JP | 10-248618 A | | 9/1998 |
| JP | 11-87972 A | | 3/1999 |
| JP | 11-87978 A | | 3/1999 |
| JP | 11-117185 A | | 4/1999 |
| JP | 2000-40894 A | | 2/2000 |
| JP | 2000-77883 A | | 3/2000 |
| JP | 2000-216584 A | | 8/2000 |
| JP | 2002-146679 A | | 5/2002 |
| WO | 99/29503 A1 | | 6/1999 |
| WO | 02/087989 A1 | | 11/2002 |

* cited by examiner (A)

(B)

SHEET MATERIAL FOR RADIO WAVE ABSORBER AND RADIO WAVE ABSORBER

This application is a 371 of international application PCT/JP2003/016452, which claims priority based on Japanese patent application Nos. 2002-374272 and 2003-183026 filed Dec. 25, 2002, and Jun. 26, 2003, respectively, which are incorporated herein by reference.

TECHNICAL FIELD

The present invention concerns a sheet material for a radio wave absorber and a radio wave absorber made of this sheet material for assembly and, more particularly, a sheet material for a radio wave absorber that can be used in the walls, ceiling and floor of an anechoic chamber and a radio wave absorber thereof.

BACKGROUND ART

The anechoic chamber is used for measurement testing the properties of antennae or radio-wave measurement testing an electronic device.

A radio wave absorber is fitted to the walls, ceiling, floor and so on of the anechoic chamber used in such measurements so as to shield the inside from external radio wave and, at the same time, prevent any radio waves generated from the internal device to be measured from radiating externally.

Many of radio wave absorbers used for such a purpose have been made of resin foam such as urethane foam, styrene foam and so on that is impregnated with carbon black, an electro-conductive material and then shaped into the wedge shape or pyramidal shape.

However, the radio wave absorber molded with the resin foam in this way is bulky and, moreover, fragile with the corner ends being broken by vibrations during the transportation or if they are knocked against something. And this increases the necessary storage space and hence the cost of storage, and a large volumetric capacity is required for the packing in order to prevent it from being broken during transportation, increasing transportation cost and thus increasing the overall cost.

To counter act such problems, it has been proposed taking the carbon black containing plate material to the site of execution and then assembling it into a radio wave absorber of hollow pyramidal shape or such like (Japanese patent application Kokai publication No. 1999-87978, Japanese patent application Kokai publication No. 2000-216584 and so on).

However, this carbon black containing plate material should be about 5 to 20 mm thick, because if it is too thin, distortion or shape instability can occur in the radio wave absorber after assembly, due to lack of rigidity. Howsoever, if the plate material is made thick, its weight also increases, deteriorating onsite workability, making it difficult to reduce transportation cost, increasing the need for carbon black, and various other such problems.

On the other hand, as an example of avoiding the weight increase of the aforementioned plate material, it has been proposed to form the aforementioned plate material into a honeycomb structure body with a number of cells arranged in a simple pattern (Japanese patent application Kokai publication No. 2000-77883).

However, the radio wave absorber assembled from this plate material of the honeycomb structure body has a problem of deteriorating the intrinsic functions as a radio wave absorber, because transmission of high-frequency electromagnetic wave is facilitated due to a structure where the cell opening is served as the radio wave incident face when the cell apertures of the honeycomb structure are large. Consequently, if this problem is to be avoided, it is necessary to reduce the cell size. As a result, the weight is increased and therefore such problems of increasing the weight in the aforementioned Japanese patent application Kokai publication No. 1999-87978 and Japanese patent application Kokai publication No. 2000-216584 can not be essentially resolved.

And though the plate material of the aforementioned honeycomb structure body has rigidity against load in the thickness direction, the mechanical strength against load in a direction orthogonal to the thickness direction may lack in some cases, and hence it can not necessarily be said to improve the assembly workability on site.

On the other hand, it has been proposed to assemble a radio wave absorber, through heat fusing the ends of a plastic paperboard molded from thermoplastic resin with carbon black added (Japanese Patent Publication No. 2760578).

However, the manufacturing cost becoming extremely high can not be avoided, because plastic paperboards are manufactured through extrusion molding. In addition, there is a problem with on site assembly workability, because assembly requires local heating and softening treatment. Moreover, when carbon black is used as the radio wave absorbing material, radio wave loss tends to decrease as the frequency becomes higher. Therefore, there is the drawback that a radio wave absorber designed for an EMC anechoic chamber utilizing 30 MHz to 1 GHz as the main frequency range does not provide a sufficient absorbing property in microwave or milliwave ranges equal or higher than the same.

DISCLOSURE OF INVENTION

An object of the present invention is to provide a sheet material for a radio wave absorber that can solve the aforementioned problems of conventional technologies while presenting excellent radio wave absorbing capacity and, moreover, being still light weighted with excellent form-retaining property and workability for field assembly, and to provide a novel radio wave absorber formed from the same.

The sheet material for a radio wave absorber of the present invention for use in attaining such an object has a following composition.

That is, the sheet material for a radio wave absorber of the present invention is characterized by having a paperboard structure with a corrugated medium and a planar liner that are layered over each other, wherein the corrugated medium and/or the liner are composed of sheets that includes electrical-loss material.

In addition, the radio wave absorber of the present invention for use in attaining the aforementioned object has a following composition.

That is, the radio wave absorber of the present invention is characterized in that the aforementioned sheet material for a radio wave absorber is cut, folded, and assembled into a hollow three-dimensional structure body, which has a shape of wedge, polygonal pyramid, or polygonal cylinder.

The sheet material for a radio wave absorber used in the present invention as mentioned above is light weighted with a hollow section and can be handled in a sheet state, thus facilitating storage, transportation and workability of field assembling, because it is based on the paperboard structure with the corrugated medium and a planar liner layered over each other.

In addition, it can improve the form-retaining property of the radio wave absorber after assembly, because, although light weight, it has appropriate rigidity from the corrugated medium.

As mentioned above, the sheet material for a radio wave absorber of the present invention, being based on the paperboard structure, is light weighted, presents a moderate rigidity, allows to reduce the transportation cost because it can be transported as a sheet and assembled easily in the field and, at the same time, facilitates the assembly work into the radio wave absorber in the field.

In addition, the storage cost can be reduced, because it can be stored compactly as a sheet.

Furthermore, the radio wave absorber of the present invention does not cause distortion not only during the assembly but also after the assembly, because the sheet material presents a moderate rigidity, allowing to maintain an excellent shape stability for a longtime.

BEST MODE FOR CARRYING OUT THE INVENTION

Hereinafter, a sheet material for a radio wave absorber of the present invention and a radio wave absorber of the same will be further described with reference to the drawings etc.

Figure 1:
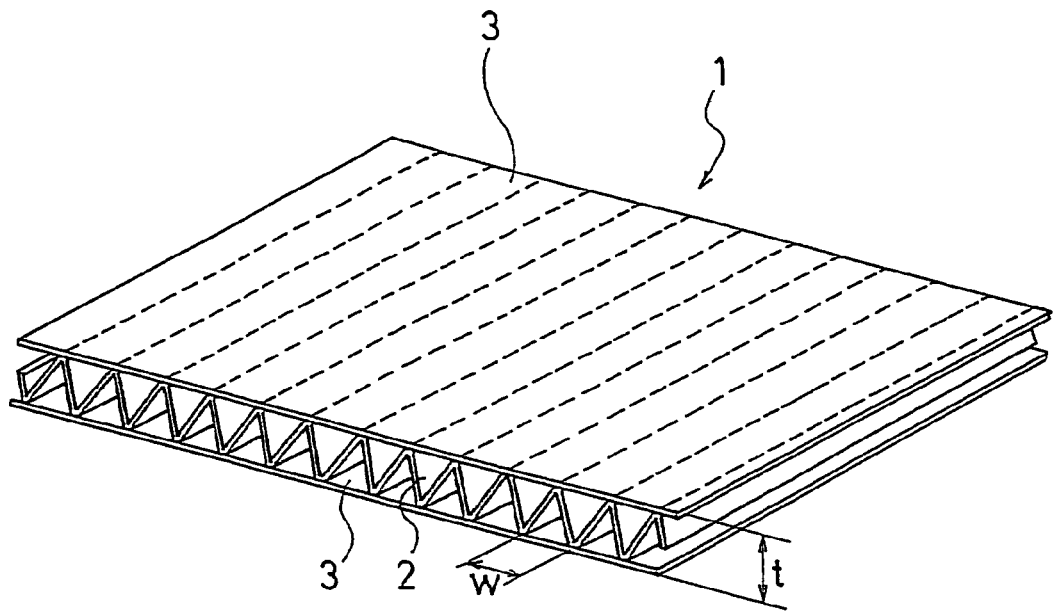
FIG. 1 is a schematic perspective view showing an example of sheet material for a radio wave absorber of the present invention.

FIG. 1 illustrates a sheet material for a radio wave absorber of the invention.

The sheet material 1 for a radio wave absorber of the present invention has a paperboard structure with a corrugated (bend into wave-like form) medium 2 sandwiched therebetween and a planar liner 3, 3 that are layered on the both sides thereof. Crest portions and valley portions of the corrugated medium 2 bent into wave-like form are adhered respectively to the liner 3, 3 through an adhesive. Moreover, a sheet including an electrical-loss material is used for the corrugated medium 2 and/or liner 3 and preferably a mixed paper including carbon fiber is used. Thus, the sheet material 1 used for assembly presents an excellent radio wave-absorbing property by mixing the electrical-loss material.

The sheet material for a radio wave absorber of the present invention composed as mentioned above is cut into a predetermined shape and, thereafter, assembled into a radio wave absorber of hollow three-dimensional structure (described in detail below) on the execution site. With the hollow structure, this sheet material for a radio wave absorber is light weighted and, at the same time, presents a moderate rigidity by involving the corrugated medium and keeps an excellent form-retaining property even after being assembled as a radio wave absorber. In addition, it is not bulky, because it can be stored or transported in a planer sheet state, allowing to reduce the transport cost.

In the sheet material for a radio wave absorber of the present invention, the sheet including the electrical-loss material is used advantageously for both of corrugated medium and liner of the paperboard structure, but it may also be composed to be used for one of them. In the case of using it for one of them, it may be preferably used for the corrugated medium.

The structure of the paperboard is not specially limited; however, it is preferably selected from single faced paperboard, double faced paperboard, double wall paperboard and triple wall, to obtain a sheet that is thin, light weighted and strong as much as possible.

Figure 2:
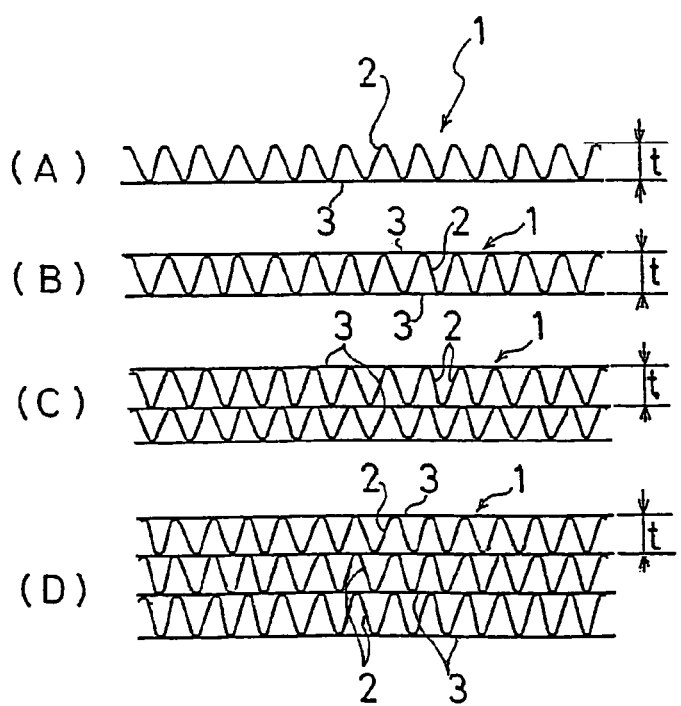
FIG. 2 (A) to (D) are respectively sectional views showing examples of a sheet material for a radio wave absorber of the present invention.

Here, the single faced paperboard designates a paperboard structure where a corrugated (undulated) medium 2 is affixed to a single liner 3, as shown in FIG. 2(A), the double faced paperboard designates a paperboard structure where a corrugated (undulated) medium 2 is joined between two liners 3, 3 as shown in FIG. 2(B) and the double wall paperboard designates a paperboard structure where a single faced paperboard is jointed to one side of the double faced paperboard, as shown in FIG. 2(C). In addition, the triple wall designates a three layered paperboard structure where another single faced paperboard is jointed to the double wall paperboard, as shown in FIG. 2(D). Among them, the double faced paperboard is preferable, because it is thin and presents a moderate rigidity at the same time.

As manufacturing method of these paperboards, a rapid well-known manufacturing method of paper paperboards offering a low manufacturing cost may be used.

To be more specific, the single faced paperboard can be made by corrugating the medium by a machine called corrugator, and pasting to the surface or back of the liner. Further, a mass production method of paperboard sheets where a single faced paperboard and liners are adhered and heated to obtain a double faced or a double wall paperboard, that is sent into a cutter always in a stable state and cut into a predetermined dimensions as a paperboard sheet can be used.

As an adhesive of the aforementioned paperboard, any of well-known adhesives such as starch glue can be used.

For the paperboard structure applied to the present invention, it is preferable to set the thickness t per a layer of the paperboard to 1 to 5 mm. If the thickness t is less than 1 mm, the weight will increase, and if it exceeds 5 mm, the volume will increase, deteriorating the workability to assemble as a radio wave absorber and the transportability.

Furthermore, in the paperboard structure, it is preferable that the take up ratio of the corrugated medium to the liner is in a range of 1.2 to 2 times, and the interval w between tops of adjacent corrugated mediums is in a range of 1 to 15 mm.

Here, the take up ratio means the ratio of the glued corrugated medium length to the liner length, and this take up ratio is preferably in the aforementioned range, considering both the gluing strength and the gluing workability. Moreover, the interval w between tops of adjacent corrugated mediums is preferably in the aforementioned range, considering both the man-hour required for the gluing step and the strength.

Different concentration of electrical-loss material can be distributed for each layer, in the case of structures where a plurality of paperboards are laminated, such as double wall paperboard or triple wall. For instance, a concentration gradient can be set by increasing the concentration of electrical-loss material of the paperboard from the radio wave incident side to the depth side. Radio wave can be absorbed more efficiently, because radio wave reflection on the surface is suppressed as much as possible and the absorption takes place in the depth side of the inside, by increasing the concentration of electrical-loss material from the radio wave incident side to the depth side gradually in this manner. Moreover, paperboards can be laminated from the radio wave incident side gradually to the depth side by reducing the thickness t thereof. A similar radio wave effect can be obtained by a concentration gradient similar to the aforementioned one for reducing gradually the thickness t of the paperboard of respective layers in this manner.

The electrical-loss material contained in the sheet material of the present invention performs the attenuation function by converting radio wave energy into an extremely small current and, furthermore, converting into heat energy.

Such electrical-loss material includes, for instance, electroconductive powders such as carbon black, carbon micro coil powder, graphite powder and so on, electroconductive fibers such as carbon fiber, silicon carbide fiber, metal fiber, metal plated fiber and so on. It may be a semiconductor fiber obtained by controlling the sintering temperature while producing carbon fiber or silicon carbide fiber.

Electroconductive fibers are particularly preferable among these electrical-loss materials and, furthermore, the carbon fiber is more preferable. The electroconductive fiber, presenting a high aspect ratio (ratio of length to size), permits to obtain a large radio wave-absorbing effect compared to the powder such as carbon black, because fibers come easily in contact with each other even if the quantity is small.

Moreover, for the electroconductive fiber, a loss by the induction of current also in the electroconductive fiber existing alone is added to the radio wave loss caused by the contact of adjacent electroconductive fibers each other in a way to let current flow through the whole medium. This phenomenon is principally a resonance phenomenon and, the current induced by the electroconductive fiber increases as the fiber length is the integer number of times of the half wavelength of the wavelength in the medium. Namely, a phenomenon where the radio wave loss decreases as the frequency becomes higher as in the carbon black loss material does not occur, because the loss by resonance phenomenon is added to the radio wave loss when the electroconductive fiber is used as the radio wave loss material. Therefore, the electroconductive fiber is excellent as loss material for a radio wave absorber that can cover a wide band range from low frequency to microwave, milliwave.

Conventionally, the upper limit frequency of the anechoic chamber for EMC was 1 GHz; however, in these years, there is a trend to extend to the proximity of 10 GHz. In the case of the sheet material for a radio wave absorber using the electroconductive fiber as electrical-loss material in the present invention, a good absorption property can be exhibited in a frequency range of 30 MHz to 1 GHz and also with a microwave frequency exceeding the same. Furthermore, a sufficient good absorption property can be exhibited in a milliwave frequency range up to the proximity of approximately 100 GHz.

The shape of the sheet including the electrical-loss material is not especially limited provided that the electrical-loss material is distributed all over the sheet. Preferably, mixed paper made by mixing electroconductive fiber and non-electroconductive fiber is advantageous, as it can be produced easily.

As non-electroconductive fiber to be mixed with electroconductive fiber, polyester fiber, nylon fiber, glass fiber, aramid fiber, polyphenylene-sulfide fiber, poly(etheretherketone) fiber, polyparaphenylene-benzobisoxasol fiber, polylactic fiber or the like can be used.

It is preferable to use a fiber presenting especially a volume resistivity larger than that of its counterpart electroconductive fiber to be mixed together by double figures or more, as this non electroconductive fiber.

As for the manufacturing method of mixed paper, any of the wet paper-making method for paper-making a slurry mixing at least one kind of electroconductive fiber and non electroconductive fiber respectively and water and the dry paper-making methods for stirring and mixing in the air at least one kind of electroconductive fiber and non electroconductive fiber respectively and collecting the same in the sheet form may be adopted. In any of the case of wet paper-making method and dry paper-making method, the mixed paper can be produced continuously by using a continuous transfer net conveyer as paper-making means. In these paper-making methods, where necessary, inorganic binders such as aluminum hydroxide or organic binders such as starch, polyvinyl alcohol, polyethylene, paraffin, acrylic fiber or the like may be added.

It is preferable to use carbon fiber as electroconductive fiber to be used in the case of wet paper-making method, because the low density facilitates the paper-making, the consumption is small as the aspect ratio can be increased or for other reasons. Here, it is advantageous to use a carbon fiber of which average fiber length is in a range of 1 to 60 mm. If the average fiber length is less than 1 mm, fibers hardly overlap each other, thus the number of contact points decreases and it becomes necessary to increase the consumption in order to compensate the decrease of contact points and, therefore, the manufacturing cost rises. On the other hand, if the average fiber length exceeds 60 mm, fibers break easily, and the consumption can not be reduced necessarily.

As the mixed paper obtained as mentioned above, one presenting an appropriate electric conductivity can be obtained easily especially by the continuous paper-making method.

Concerning the electric conductivity of the mixed paper, it is preferable that the ratio (y/p) of the maximum electric conductivity (p) thereof and the electric conductivity (y) measured in a direction orthogonal to the measurement direction that has presented the maximum value is in a range of 0.35 to 0.95, when the maximum value of the electric conductivity that the mixed paper has is p. For the mixed paper manufactured by the continuous paper-making method, the electric conductivity measured in the longitudinal direction of the mixed paper corresponds to the maximum value (p), as electroconductive fibers tend to orient in the net conveyer movement direction thereof; therefore, those where the ratio (y/p) with the electric conductivity (y) in the breadth direction which is orthogonal to the same is 0.35 to 0.95 are desirable.

When electroconductive fibers are mixed as mentioned above, fibers run easily parallel to the net conveyer transfer direction and the electric conductivity in the longitudinal direction of the mixed paper tends to be high. The fact that the electric conductivity presents the directional property means that the directional property is generated in the current fluidity and a phenomenon where the absorbing ability differs according to the direction of the electric field vibration face of the incident radio wave, namely polarization dependence is provoked in the absorbing ability. However, in practice, absence of polarization dependence in the absorbing ability being required, it is desirable to limit the directional property of the electric conductivity as small as possible and therefore, it is preferable to set the aforementioned ratio of electric conductivity (y/p) in the range of 0.35 to 0.95.

If the ratio of electric conductivity is smaller than 0.35, the directional property becomes excessively large, which is practically undesirable. On the other hand, if it is lager than 0.95, the fiber orientation becomes excessively arbitrary, the longitudinal strength of the mixed paper lowers largely, often provoking paper cut during the paperboard manufacturing. As for the method setting the ratio of electric conductivity to the aforementioned range, it can be achieved easily by controlling the net conveyer movement speed mentioned above.

The mixture quantity of electroconductive fiber, especially carbon fiber, in the mixed paper is preferably in a range of 0.08 to 20 wt %, and more preferably in a range of 0.2 to 2 wt %. Lower than 0.08 wt % the electrical loss lowers and, consequently, the radio wave absorbing ability lowers. On the other hand, over 20 wt %, though the electric loss increases, more radio wave will be reflected undesirably.

Moreover, in the case where the electroconductive fiber is carbon fiber, the content of sizing agent in the carbon fiber outer skin section is preferably not more than 0.9 wt % to the whole carbon fiber quantity and, most preferably, 0%. In some cases, some sizing agent is provided in the outer skin section in the manufacturing step of carbon fiber. If the content of this sizing agent is excessive, the electric conductivity by superposed fibers each other will be inhibited and, consequently, the radio wave absorbing ability lowers; however, if the consumption of carbon fiber is increased for compensation, the manufacturing cost of the sheet material increases. Therefore, the content of sizing agent is preferable to be set as mentioned above.

The sheet such as mixed paper including electric loss material obtained as mentioned above is made as a sheet material for a radio wave absorber, by using it for a corrugated medium and/or liner of a paperboard structure to form a paperboard structure body. The sheet such as mixed paper including electric loss material may be used at least for one of corrugated medium or liner of the paperboard structure and, preferably used for the corrugated medium bent into wave-like form, more particularly.

The sheet face may be the radio wave incident face by adopting a sheet material of paperboard structure and an excellent radio wave absorbing ability can be exhibited, because radio wave can not be transmitted, as the case of publicly known honeycomb structures where the cell opening corresponds to the radio wave incident face. Also, when the sheet including electric loss material is used for the corrugated medium, radio waves reflect irregularly and finely by hitting the corrugated waveform face in a way to set off each other, allowing to absorb radio wave efficiently.

Besides, in this sheet material for a radio wave absorber comprising the paperboard structure of the present invention, it is preferable that at least one indication mean selected from printing of color, pattern or letter, embossing of pattern or letter and so on is executed on at least one side of the liner surface. Such execution of the indication by printing or embossing of various colors, patterns and so on permits to provide rich expressions to the radio wave absorber. As a result, a dark and oppressing atmosphere of the conventional anechoic chamber where a black or dark blue monochromatic radio wave absorber is affixed can be resolved, contributing to improve the work environment of a measurer.

Furthermore, in the case of onsite assembly of the sheet material for a radio wave absorber as a radio wave absorber, the assembly workability can be enhanced furthermore, if face and back indication of the sheet material, assembly instructions or the like are printed or embossed on the surface thereof.

As mentioned above, the sheet material for a radio wave absorber of the present invention can exhibit its ability as a radio wave absorber only by cutting into a predetermined size and pasting to the execution site in the sheet state, because it has a paperboard structure where a corrugated medium and a planar liner are layered and, at the same time, the corrugated medium and/or the liner are composed of a sheet comprising an electrical-loss material. It becomes especially effective, when the corrugated medium is composed of a sheet comprising an electrical-loss material.

In a still more preferable use embodiment, it is preferable to cut so as to ready to assemble as a hollow three-dimensional structure body and, thereafter, assemble as a radio wave absorber of hollow three-dimensional structure body on the execution site. Though it is preferable to cut the sheet material for assembly before transporting to the execution site, it may also be cut on the site.

The form is not especially limited in the case of assembly as a hollow three-dimensional structure body and, for instance, a shape of wedge, polygonal pyramid such as quadrangular pyramid, triangular pyramid and so on (pyramidal shape), or polygonal cylinder such as triangle pole, square pole and so on can be adopted. The radio wave-absorbing ability can be improved by forming especially the tip as pointed three-dimensional shape so that the radio wave reflection is reduced. Moreover, if a lattice composed of the sheet material for a radio wave absorber, or a support is installed inside the hollow three-dimensional structure body, this works as the inner radio wave absorber, allowing to dramatically enhance the absorbing property of high frequency in particular.

For example, an inner radio wave absorber can be also constructed by arranging a conductive thin member in parallel to a bottom surface of the radio wave absorber inside the hollow three-dimensional structure body, or an inner radio wave absorber can be constructed by arranging a conductive thin member perpendicularly to the bottom surface of the radio wave absorber inside the radio wave absorber. The inner radio wave absorber has an advantage that it can absorb electromagnetic wave which enters inside the structure of pyramid or wedge shape without being absorbed in the hollow three-dimensional structure body obtained by folding work or the like of sheets for a radio wave absorber of an electrical-loss material. This inner radio wave-absorbing body allows the radio wave-absorbing body to increase a radio wave absorption amount.

Furthermore, inserting the inner radio wave absorber reinforces the mechanical strength of the hollow three-dimensional structure body of a pyramidal shape and a wedge shape in addition to an advantage of improving the radio wave-absorbing property.

Now, concrete embodiments shall be described for the case of assembly as a hollow three-dimensional structure body.

Figure 3:
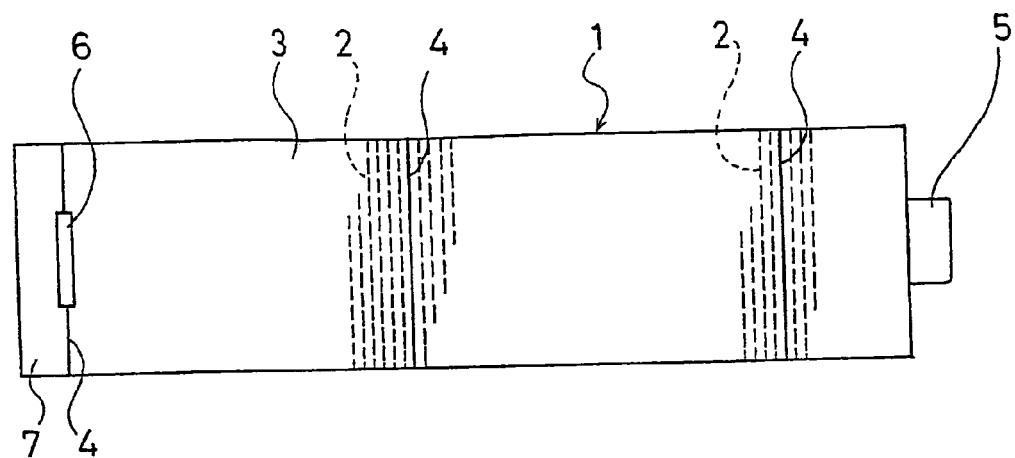
FIG. 3 is a plan view showing an example of cutting of sheet material for a radio wave absorber of the present invention.
Figure 4:
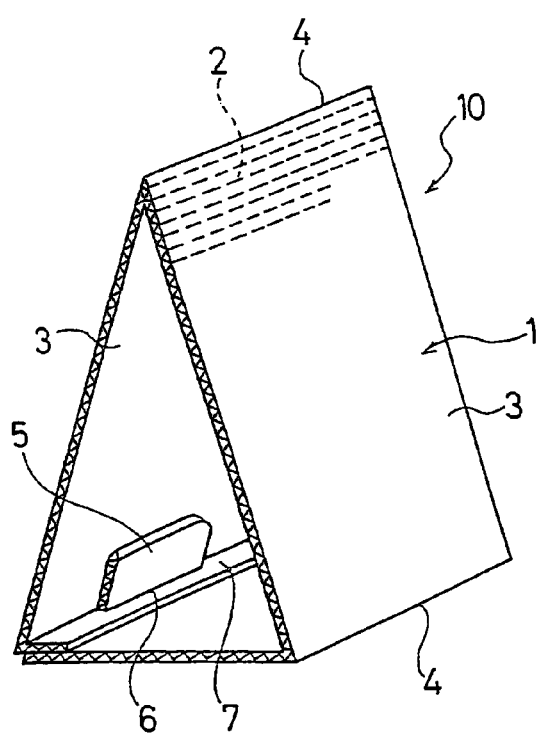
FIG. 4 is a perspective views of a radio wave absorber assembled from the sheet material for assembly of FIG. 3.

FIG. 3 illustrates a shape after cutting of the sheet material for a radio wave absorber of the present invention and FIG. 4 shows a state where this cut sheet material is assembled as a wedge form radio wave absorber of hollow three-dimensional structure body.

A plurality of folds 4 are embossed on the cut sheet material 1 with a predetermined interval and parallel to wave rows of the corrugated medium 2. An insert flap 5, an insert slit 6 and an overlap width 7 are formed on both ends. The folds 4 are formed in parallel to the wave rows of the corrugated medium 2 as illustrated, and such formation of the folds 4 facilitates to fold the sheet for assembly 1 along the folds 4 without distorting the same.

The aforementioned sheet material for a radio wave absorber 1 can be assembled easily as a wedge form radio wave absorber 10 of hollow three-dimensional structure body as shown in FIG. 4, by bending along the fold 4, introducing the insert flap 5 of one end into the insert slit 6 of the other end and binding the overlap width 7 with adhesive.

Figure 5:
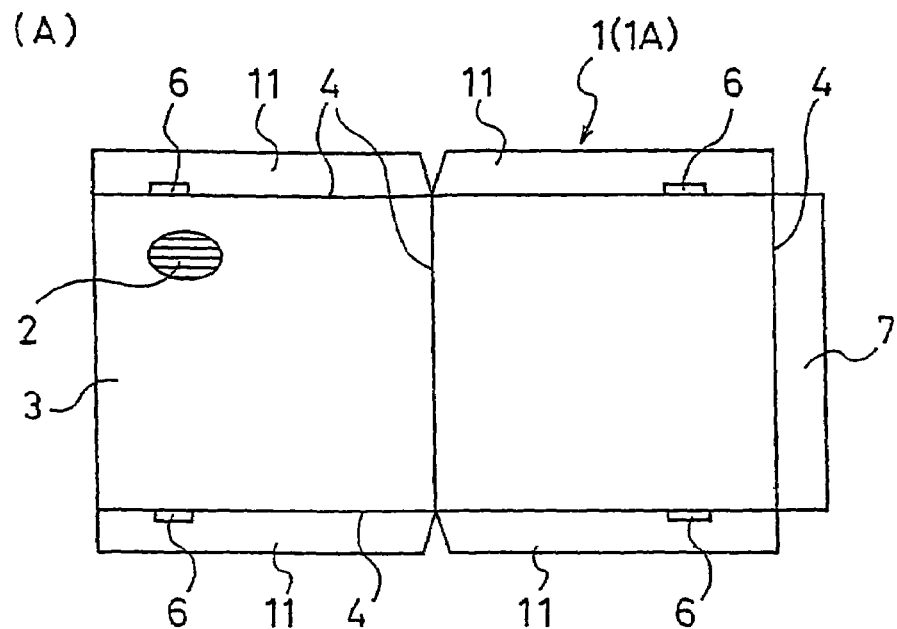
FIG. 5 (A), (B) are plan views showing examples of cutting of sheet material for a radio wave absorber of the present invention.
Figure 5:
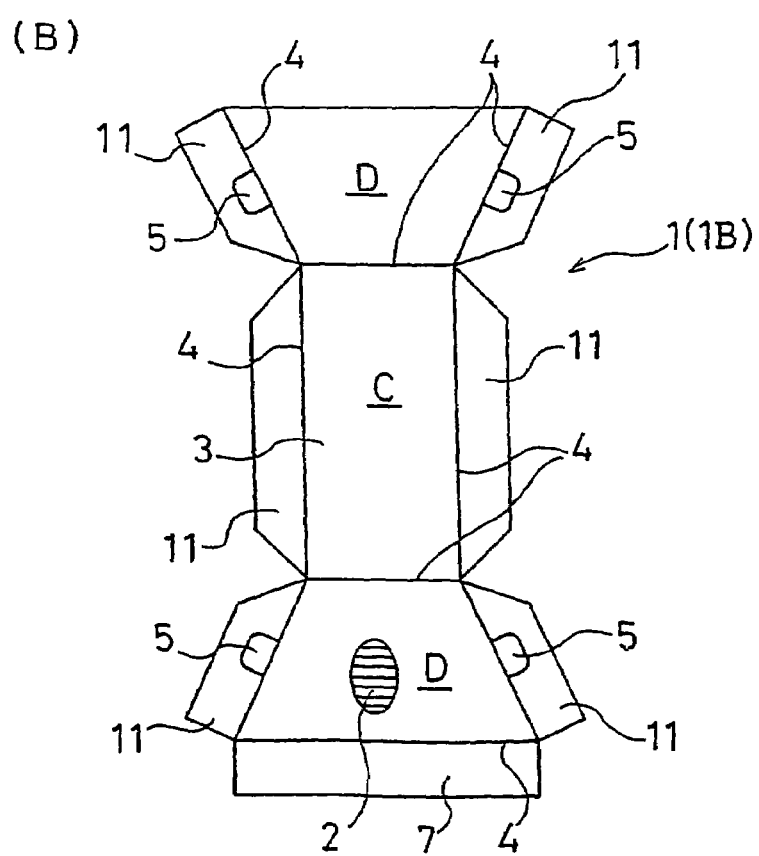
Figure 6:
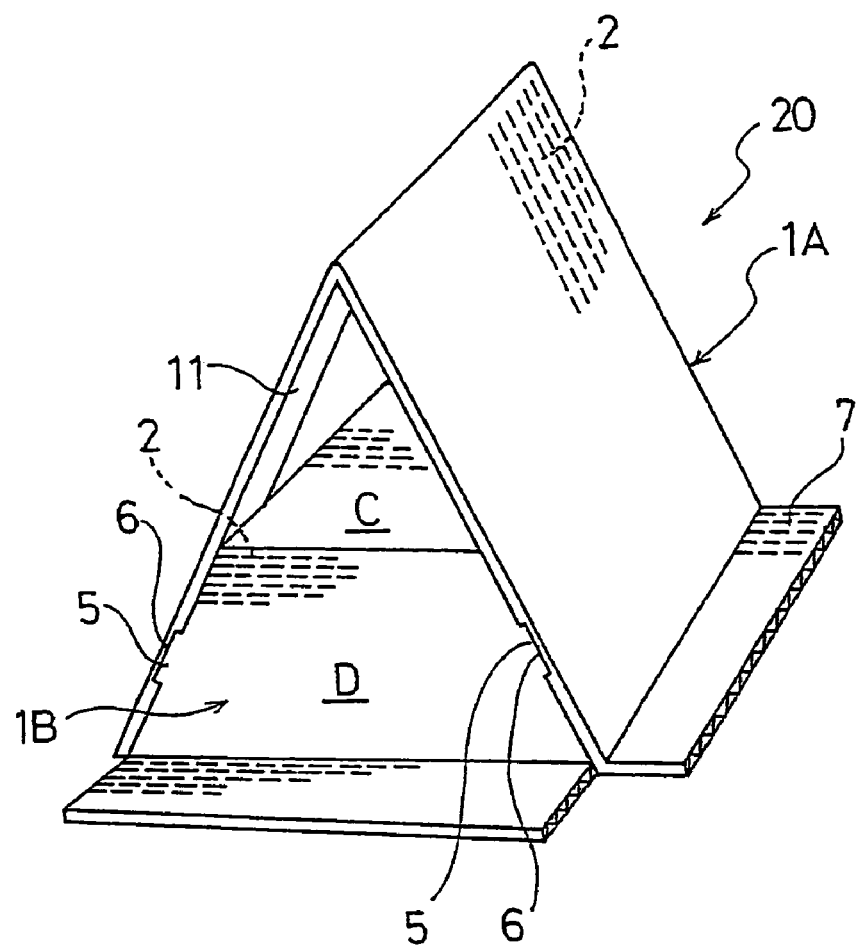
FIG. 6 is a perspective view of a radio wave absorber assembled from the sheet material for assembly of FIG. 5 (A), (B)

FIG. 5 (A), (B) illustrates a shape after cutting of another embodiment of the sheet material for a radio wave absorber of the present invention and FIG. 6 shows a state where this cut sheet material is assembled as a wedge form radio wave absorber of hollow three-dimensional structure body.

A sheet material for assembly 1A (refer to FIG. 5(A)) for forming a wedge outer shape portion of the hollow three-dimensional structure body and a sheet material for assembly 1B (refer to FIG. 5(B)) for forming a support part for supporting a leg of the wedge outer portion.

The sheet material for assembly 1A of FIG. 5(A) is arranged, as shown by the cutaway view, so that the corrugated medium 2 sandwiched by upper and lower double side liners 3 makes wave rows of the waveform in the right-left direction of the drawing. A fold 4 is embossed approximately at the middle crossing the wave rows of the corrugated medium 2 at right angles.

Besides, folds 4 respectively parallel to the wave rows of the corrugated medium 2 are embossed on the upper and lower both ends, and an outer shape reinforcing part 11 and an insert slit 6 are formed on the both outsides thereof.

Also, a fold 4 is embossed at the right end in the drawing so as to cross the wave rows of the corrugated medium 2 at right angles and an overlap width 7 to the anechoic chamber wall face is formed on the outside thereof.

The sheet material for assembly 1B of FIG. 5(B) forms a rectangular shape C in the middle and trapezoidal shape D on both sides thereof by embossing folds 4 parallel to the wave rows of the corrugated medium 2 respectively at 2 points inside. An outer shape reinforcing part 11 and an insert flap 5 are formed outside both the right and left sides of the trapezoidal shape D in the 2 places, by embossing folds 4 crossing respectively the wave rows of the corrugated medium 2 aslant. Only one side of the insert flap 5 falling on the fold 4 is linked, while remaining 3 sides are formed to be detached from the outer shape reinforcing part 11. A fold 4 parallel to the wave rows of the corrugated medium 2 is embossed at the end of one of two trapezoidal shapes D, and a overlap width 7 to the anechoic chamber wall face is formed on the outside thereof.

The sheet materials for assembly 1A, 1B cut as mentioned above are assembled as a wedge form radio wave absorber 20 as shown in FIG. 6, by respectively folding the sheet material for assembly 1A into the wedge form along the fold 4 and the sheet material for assembly 1B into the support part, and mounting them.

In short, the sheet material for assembly 1A is folded into the wedge form along the fold 4 of the center and, at the same time, the outer shape reinforcing parts 11 on both sides are folded inside at the point of the fold 4, while the overlap width 7 is folded outside. On the other side, the trapezoidal shapes D on both sides of the sheet material for assembly 1B are forded into the gate form and, at the same time, respective outer shape reinforcing parts 11 are folded inside, and four (4) insert flap 5 are made to protrude respectively. The support part of the sheet material for assembly 1B formed into the gate shape in this manner is introduced into the leg of the sheet material for assembly 1A folded into the wedge form and, at the same time, the insert flap 5 at the end of the one is introduced into the insert slit 6 of the other end of the other, allowing to assemble them as wedge form radio wave absorber 20 of hollow three-dimensional structure body shown in FIG. 6. The form of the hollow three-dimensional structure body is fixed by introducing the insert flap 5 into the insert slit 6 in this way, allowing to enhance the field workability dramatically. It goes without saying that they may be assembled with an adhesive agent so long as it does not deteriorate the workability.

Figure 7:
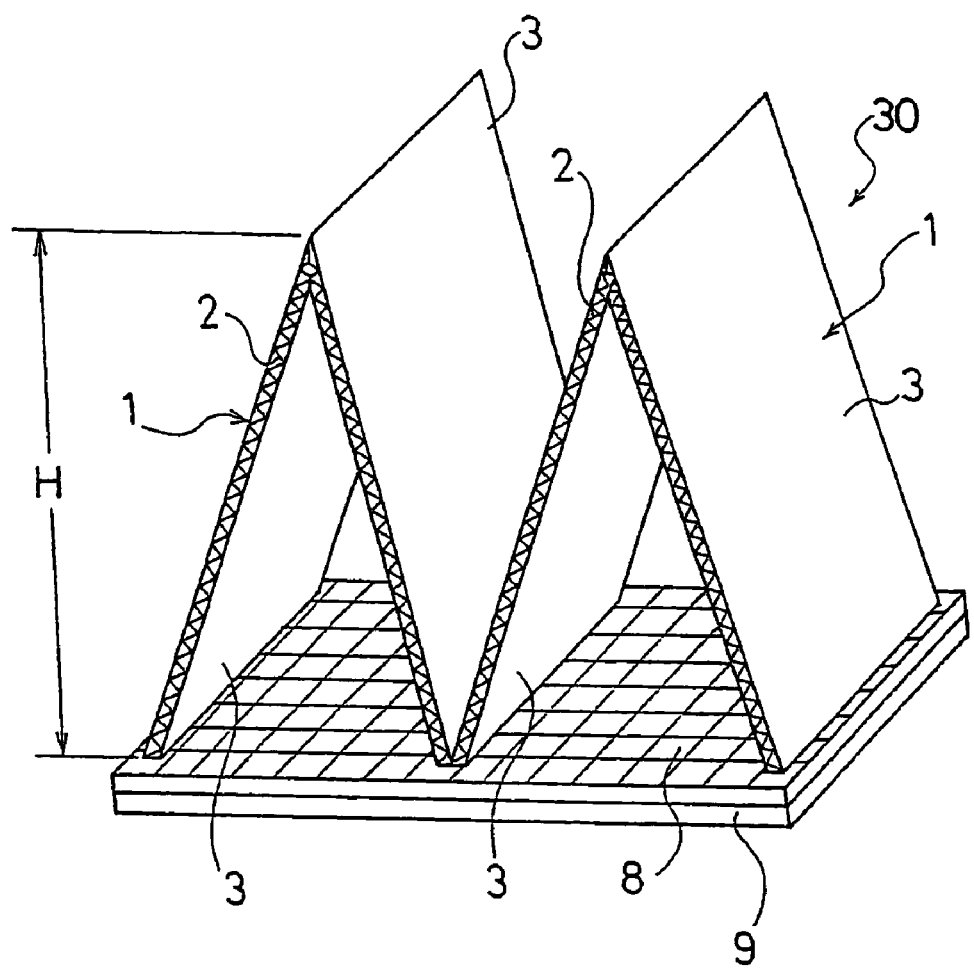
FIG. 7 is a perspective view of a radio wave absorber according to another embodiment of the present invention.

FIG. 7 shows a wedge form radio wave absorber according to still another embodiment of the present invention.

In this radio wave absorber 30 of this embodiment, the sheet for assembly 1 is cut into two, folded into the wedge form respectively, adhered and fixed respectively in parallel on a sintered ferrite plate 8 where an aluminum plate 9 is pasted to the back.

Such combination with the sintered ferrite plate permits to cover the radio wave absorption of a specific low frequency range supposed to be necessary especially for an EMC anechoic chamber, thus obtain excellent properties even when the height of the radio wave absorber is reduced compared to the wavelength to be absorbed and use as much space of the anechoic chamber as reduced. For instance, there is provided an effect that a height H of 2 m necessary for the case where the radio wave absorber is used alone without combining the sintered ferrite plate can be reduced to 1 m.

Figure 8:
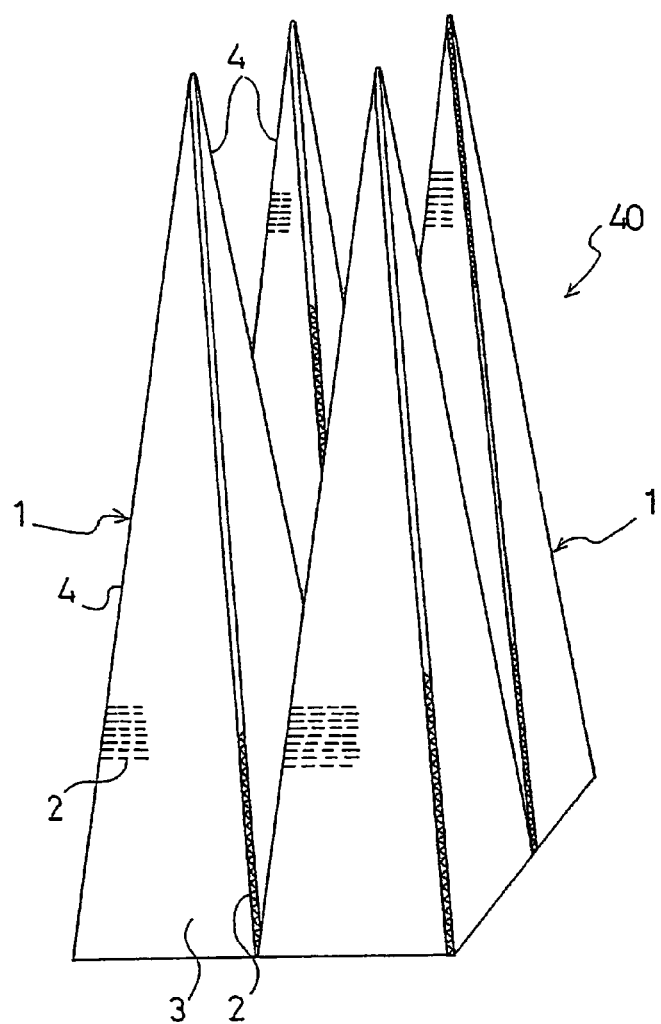
FIG. 8 is a perspective view of a radio wave absorber according to still another embodiment of the present invention.

FIG. 8 shows a pyramidal form radio wave absorber according to still another embodiment of the present invention.

The sheet for assembly 1 for assembling this pyramidal form radio wave absorber 40 is cut so that four (4) isosceles triangles are connected along the folds 4. Angles of the wave rows of the corrugated medium 2 to the folds of four (4) isosceles triangles are different each other, as they are cut out from a single sheet material.

Figure 9:
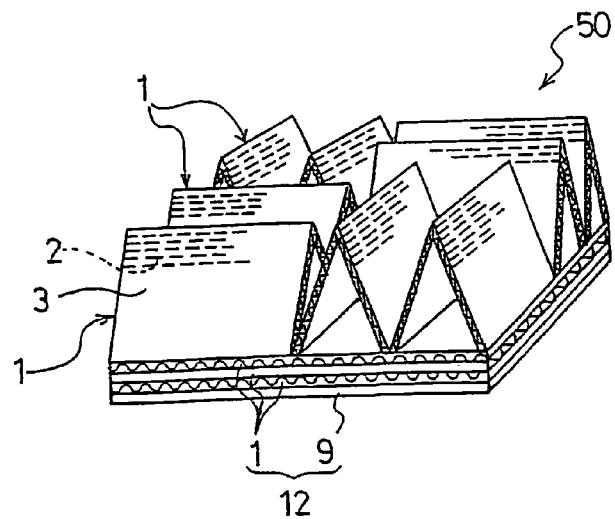
FIG. 9 is a perspective view of a radio wave absorber according to still another embodiment of the present invention.

FIG. 9 shows a wedge form radio wave absorber according to still another embodiment of the present invention.

The radio wave absorber 50 of this embodiment is composed by erecting eight (8) hollow three-dimensional structure bodies made of the sheet for assembly 1 on a common pedestal 12. The pedestal 12 is composed by arranging an aluminum plate 9 at the lowest portion and laminating three (3) sheet materials for assembly 1 thereon so that wave rows of the corrugated medium 2 cross each other with right angles between layers. The hollow three-dimensional structure body is composed by folding eight (8) cut sheet materials for assembly 1 respectively in two wedges, making them a set and erecting so that corrugated ridge line directions of wedges cross each other among adjacent hollow three-dimensional structure bodies.

Such arrangement is appropriate for absorbing microwaves to milliwaves of particularly short wavelength, because the pedestal 12 absorbs a little radio wave that could not be absorbed completely by the hollow three-dimensional structure body, improving the absorbing properties furthermore. The absorbing properties vary according to whether the electric field vibration face of incident radio wave and the wedge edge line are parallel or vertical.

In short, though the wedge form radio wave absorber is essentially polarization dependent because of the shape thereof however, the polarization dependence can be avoided by arranging adjacent wedge form radio wave absorbers so that the wedge edge lines cross each other, as the embodiment shown in FIG. 9.

It is possible to make the sheet material for a radio wave absorber of the present invention as a radio wave absorber for milliwave band by laminating one layer or two or more layers thereon on a reflection flat plate.

A layer height 1 to 5 mm of the corrugated medium of the sheet for radio wave absorber is at the same order as the waveform approximately in the milliwave band, because, for instance, the wave lengths at 30 GHz and 100 GHz are respectively 10 mm and 3 mm. The corrugated medium itself of the sheet material for a radio wave absorber can function as a wedge form radio wave absorber for the milliwave, because the wedge form radio wave absorber generally presents better wave absorbing properties from the vicinity where the height thereof becomes the same order as the wavelength. It is preferable to compose the corrugated medium with a sheet comprising an electrical-loss material in the case of using the sheet material for a radio wave absorber as a sheet for a radio wave absorber in this manner.

Besides, in the case of composing the radio wave absorber in a sheet state, it can be so composed to laminate two or more layers and, in this case, they may be laminated so that the wave rows of the corrugated medium cross each other between layers. Such lamination form can cancel the polarization dependence of the radio wave absorber. Moreover, in the case of composing the radio wave absorber in a state of sheet, it may be also possible to improve properties furthermore, by changing the concentration of electrical-loss material contained in the corrugated medium across the lamination direction.

Embodiment of Inner Radio Wave Absorber (1)

Figure 10:
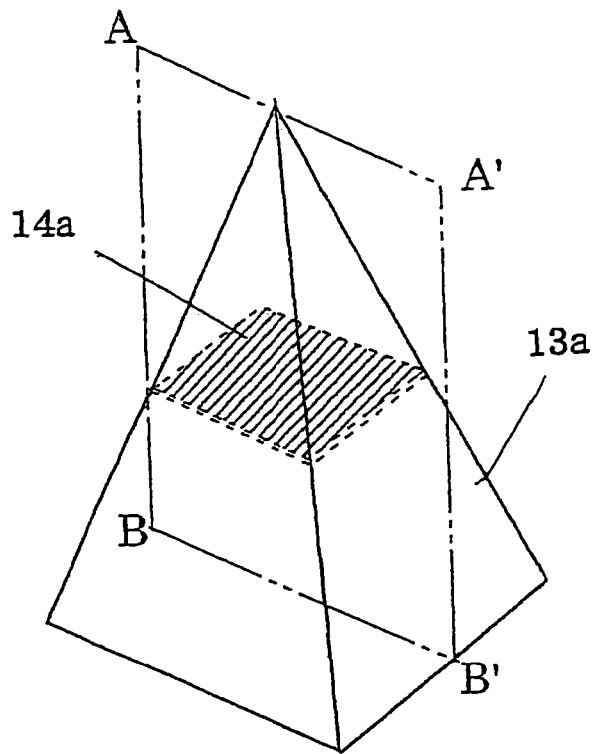
FIG. 10 shows a radio wave absorber of a pyramidal shape illustrating an embodiment of the present invention.
Figure 11:
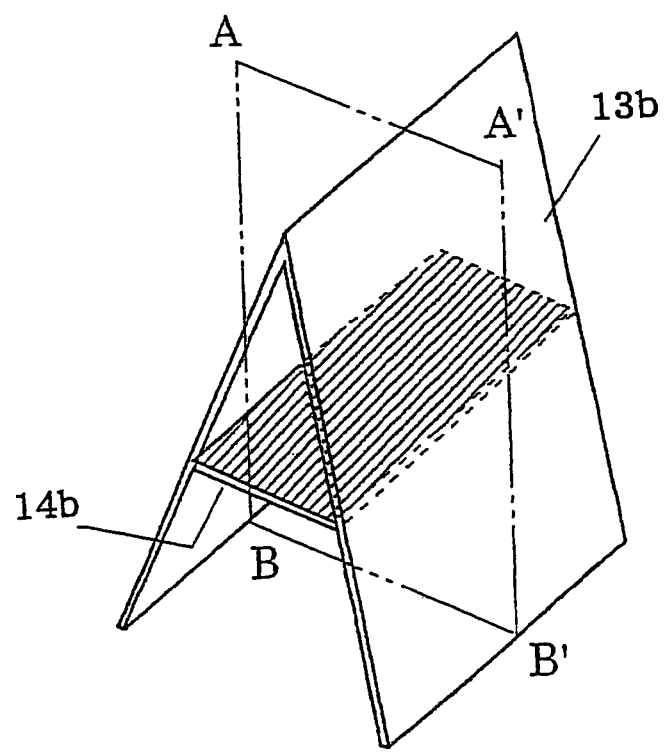
FIG. 11 shows a radio wave absorber of a wedge shape illustrating an embodiment of the present invention.

FIG. 10 and FIG. 11 show an embodiment according to the present invention. 13 denotes a hollow three-dimensional structure body of conductive thin member formed into a pyramidal shape or a wedge shape by folding etc. 14 denotes an inner radio wave absorber made from the conductive thin member.

Figure 12:
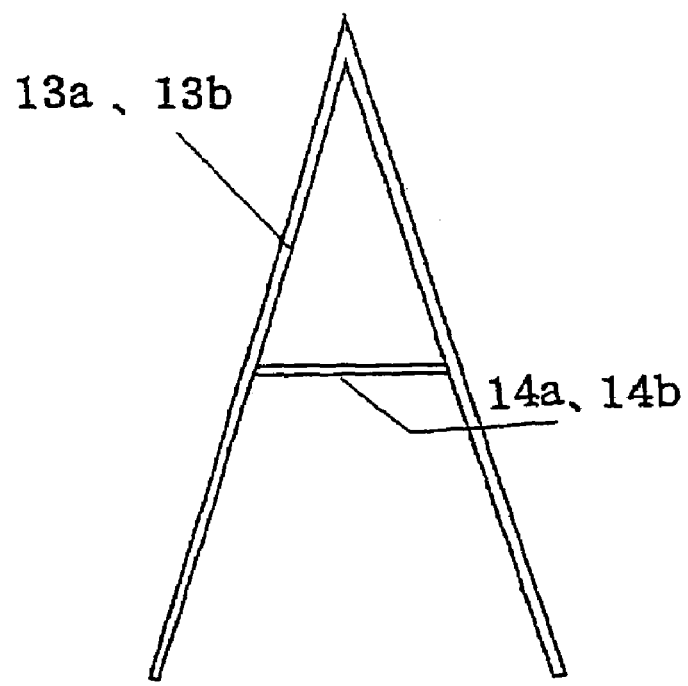
FIG. 12 is a cross sectional view of the radio wave absorber shown in FIGS. 10 and 11, as their shapes of cross-section are identical, one figure is used to explain them.

FIG. 12 is a cross sectional view cut along A-A'-B-B' surface of the embodiments in FIG. 10 and FIG. 11.

When the inner radio wave absorber 14 is inserted at a position too close to the top A-A', there is only a slight effect since the area of the inner radio wave absorber 14 is small. On the other hand, when the inner radio wave absorber 14 is inserted at a position too close to the bottom surface B-B', an effect of inserting the inner radio wave absorber 14 is also small due to a boundary condition where electric component of the incident electromagnetic wave becomes smaller when mounting for B-B' to contact with the metal plate. In order to increase the effect of the inner radio wave absorber 14, according to the experimental result, it is preferable to divide a length from A-A' to B-B' into three, then to mount at the middle of the divided positions.

Figure 13:
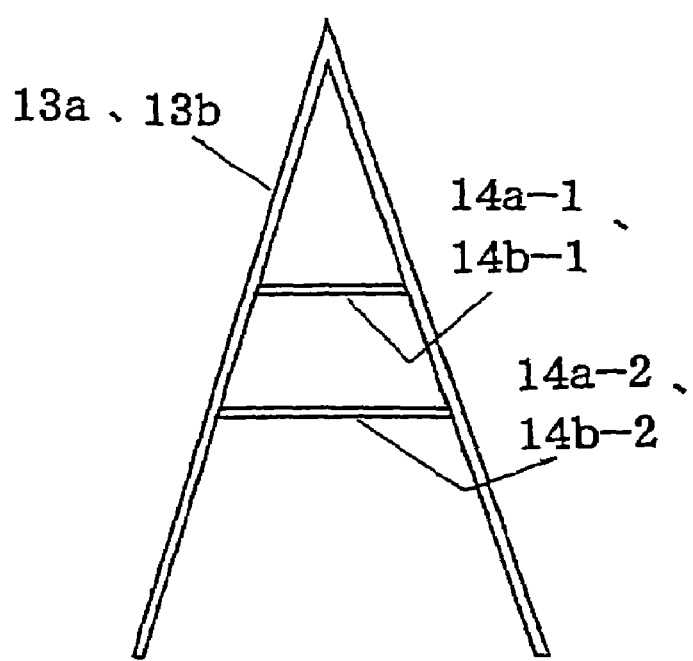
FIG. 13 is a cross sectional view showing an embodiment in the case that two inner radio wave absorbers are arranged in FIGS. 10 and 11, as their shapes of cross-section are identical, one figure is used to explain them.

FIG. 13 is also a cross sectional view similar to FIG. 12 and shows an embodiment in which two conductive thin members 14a and 14b are mounted as inner radio wave absorbers. Like this example it is possible to mount a plurality of conductive thin members. As the number of the conductive thin members is larger, it becomes closer condition where inside of the hollow three-dimensional structure body is filled up with loss material, thus causing a tendency of increasing the radio wave-absorbing property at the high frequency.

Embodiment of Inner Radio Wave Absorber (2)

Figure 14:
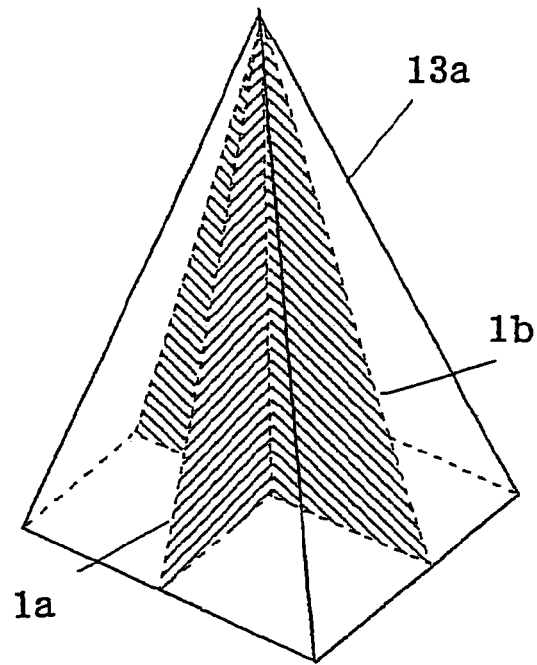
FIG. 14 shows a radio wave absorber of a pyramidal shape according to an embodiment of the present invention.

FIG. 14 shows an embodiment of the present invention. In the structure of the embodiment, two triangular-shaped sheets for a radio wave absorber 1a, 1b two sides of which are the inner wall surface of a hollow three-dimensional structure body 13 of pyramidal shape to match with each other at a right angle to form an inner radio wave absorber, and arrange this perpendicularly to the bottom of the pyramid. The reason to compose two triangular shaped conductive thin members 1a, 1b perpendicularly each other is to eliminate a polarization property of an absorption property against the incident electromagnetic wave.

Figure 15:
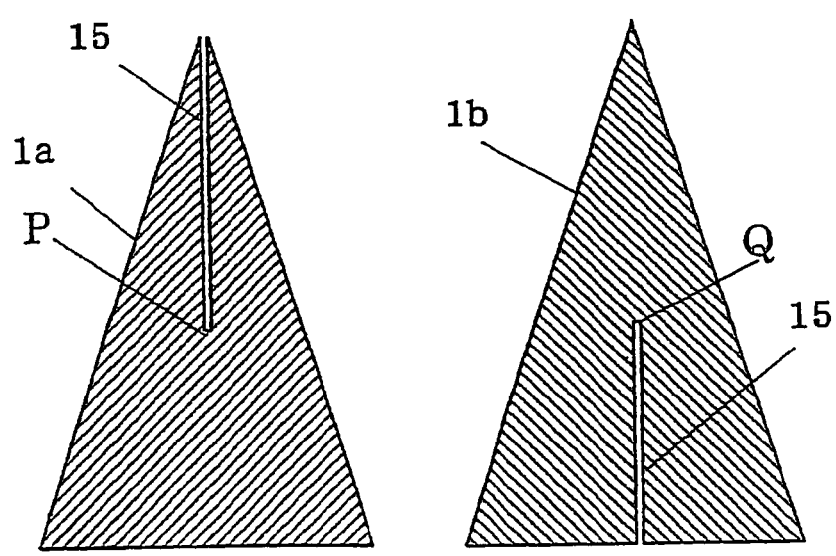
FIG. 15 shows a block diagram of an inner radio wave absorber used for the radio wave absorber of the pyramidal shape shown in FIG. 14.

FIG. 15 shows an example of a structure of the triangular shaped sheet for a radio wave absorber 1a, 1b used in FIG. 14.

1a provided with a notch part 15 from a peak of the triangle to a base thereof. On the other hand, 1b provided with a notch part 15 from a base of the triangle to a peak thereof. Each triangle crosses to another triangle at the notch part to match the end points P, Q of the notch parts so as to make a right angle between 1a and 1b to form an inner radio wave absorber.

Embodiment of Inner Radio Wave Absorber (3)

Figure 16:
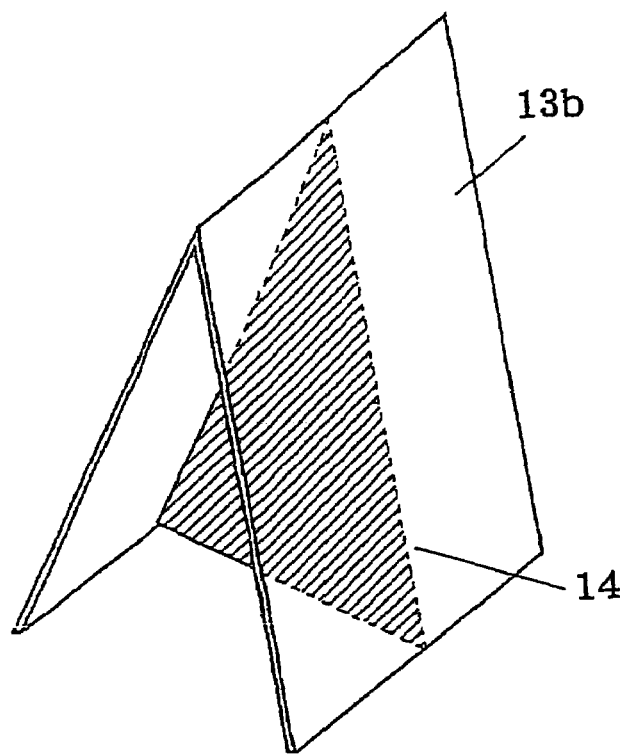
FIG. 16 shows a radio wave absorber of a wedge shape in an embodiment of the present invention.

FIG. 16 shows another embodiment of the present invention. It is a structure in which a piece of conductive thin member of an isosceles triangle shape is arranged perpendicularly to the ridge line of the wedge inside of the hollow three-dimensional structure body 13 of a wedge shape as an inner radio wave absorber 14. The inner radio wave absorber 14 may be located in any position of ridge line direction of the wedge.

Figure 17:
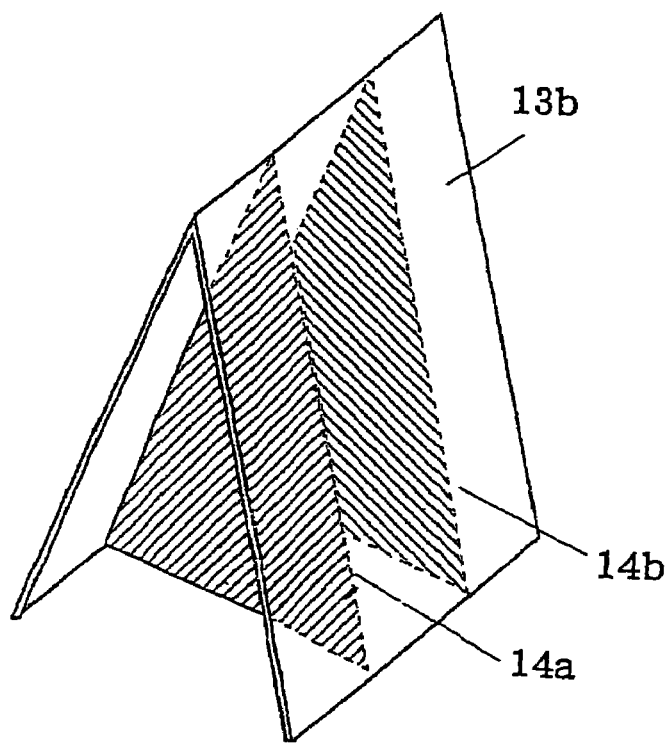
FIG. 17 shows an embodiment in the case that two inner radio wave absorbers are arranged in the embodiment shown in FIG. 16.

FIG. 17 shows a structure in which two inner radio wave absorbers 14a, 14b in the embodiment illustrated in FIG. 16. As such, it is possible to mount a plurality of conductive thin members. As the number of the conductive thin members is larger, it becomes closer condition where inside of the hollow three-dimensional structure body is filled up with loss material, thus causing a tendency of increasing the radio wave-absorbing property at the high frequency.

EMBODIMENTS

Embodiment 1

Carbon fiber having sizing agent content rate of 0% and average fiber length of 12 mm, chopped glass fiber and aramid pulp are mixed in a ratio of 3 wt %, 77 wt % and 20 wt % respectively and submitted to the wet paper-making method to obtain an incombustible sheet A including an electrical-loss material of 0.25 mm in thick, 150 g/m² in basis weight. On the other hand, chopped glass fiber and aramid pulp are mixed in a ratio of 80 wt % and 20 wt % respectively and submitted to the wet paper-making method to obtain an incombustible sheet A not including an electrical-loss material of 0.25 mm in thick, 150 g/m² in basis weight, and thereafter, a sheet B where a moss green color is printed on one side of the sheet is obtained. Here, the non-combustibility designates to be flameproof 1 grade of JIS A 1322 test, combustibility test, or V-0 class in UL-94 thin material vertical combustion test.

Thus obtained sheet A is used for the liner on one side and the corrugated medium, the sheet B is used for the liner of the other side making the printed face outside and the corrugated medium is corrugated to manufacture a double faced paperboard of 2.5 mm in height, 1.5 times in take up ratio and 5 mm in interval between adjacent crests. A starch base adhesive of approximately 5 g/m² is used for affixing the corrugated medium and the liner. The fire retardancy of the double faced paperboard was flameproof 1 grade of JIS A 1322 test and V-0 class in UL-94 thin material vertical combustion test.

Next, this paperboard is cut into four (4) sheet materials of 60 cm×201 cm, short sides of two of them are joined respectively with a paper tape, to make two (2) wedge form assemblies of 30 cm×60 cm bottom side×2 m height. These two wedge form assemblies are fixed in parallel on an aluminum plate of 60 cm in length×60 cm in width×1 mm in thickness, to obtain a wedge form radio wave absorber of 60 cm×60 cm bottom side×about 2 m height.

In the manufacturing process of the aforementioned radio wave absorber, no distortion or the like has occurred in the assembly, and it could be assemble as a radio wave absorber presenting an excellent form-retaining property.

In addition, the radio wave-absorbing property of thus obtained radio wave absorber was measured, to obtain an excellent radio wave-absorbing ability of −15 dB to −20 dB in a frequency range of 30 MHz to 300 MHz.

It should be appreciated that the radio wave-absorbing ability of this time was determined from the difference of reflection level by measuring the reflection of the time when radio wave is applied vertically to an aluminum plate of 60 cm in length×60 cm in width×1 mm in thickness, and that obtained when radio wave is applied similarly to the radio wave absorber of the same area.

Embodiment 2

A paperboard same as the one manufactured in the embodiment 1 is cut into four (4) sheet material of 60 cm×101 cm, short sides of two of them are joined respectively with a paper tape, to make two (2) wedge form assemblies of 30 cm×60 cm bottom side×1 m height. These two wedge form assemblies are fixed in a way to arrange on a sintered ferrite plate of 60 cm in length×60 cm in width×5.7 mm in thickness, and an aluminum plate of 60 cm in length×60 cm in width×1 mm in thickness is affixed to the back of the sintered ferrite plate, to obtain a wedge form radio wave absorber of 60 cm×60 cm bottom side×about 1 m height.

In the manufacturing process of the aforementioned radio wave absorber, no distortion or the like has occurred in the assembly, and it could be assembled as a radio wave absorber presenting an excellent form-retaining property. In addition, the radio wave-absorbing property of thus obtained radio wave absorber was measured, to obtain an excellent radio wave-absorbing ability of −15 dB to −20 dB in a frequency range of 30 MHz to 300 MHz.

Embodiment 3

A paperboard same as the one manufactured in the embodiment 1 is cut to have embossed folds, insert flaps and insert slits as shown in FIG. 3 to work out two (2) sheet materials for assembly. Two (2) wedge form assemblies of 1 m height, 30 cm×60 cm bottom side respectively as shown in FIG. 4 were made from these two (2) sheet materials for assembly. These two wedge form assemblies are fixed in parallel on a sintered ferrite plate same as the embodiment 2, and an aluminum plate same as the embodiment 2 is affixed to the back of the sintered ferrite plate, to obtain a wedge form radio wave absorber of 60 cm×60 cm bottom side×about 1 m height.

In the manufacturing process of the aforementioned radio wave absorber, no distortion or the like has occurred in the assembly, and it could be assembled as a radio wave absorber presenting an excellent form-retaining property. In addition, the radio wave-absorbing property of thus obtained radio wave absorber was measured, to obtain an excellent radio wave-absorbing ability of −15 dB to −20 dB in a frequency range of 30 MHz to 300 MHz.

Embodiment 4

Carbon fiber having sizing agent content rate of 0% and average fiber length of 6 mm, chopped glass fiber and aramid pulp are mixed in a ratio of 0.8 wt %, 70 wt % and 29.2 wt % respectively and submitted to the wet paper-making method to obtain an incombustible sheet C including electrical-loss material of 0.25 mm in thick, 150 g/m² in basis weight. On the other hand, chopped glass fiber and aramid pulp are mixed in a ratio of 80 wt % and 20 wt % respectively and submitted to the wet paper-making method to obtain an incombustible sheet A not including electrical-loss material of 0.25 mm thick, 150 g/m² basis weight and, thereafter, a sheet D where a moss green color is printed on one side of the sheet was obtained.

Thus obtained sheet C is used for the corrugated medium, the sheet D is used for the liners of both sides making the printed face outside and the corrugated medium is corrugated to manufacture a double faced paperboard of 2.5 mm in layer height, 1.5 times in take up ratio and 5 mm in interval between adjacent crests. A starch base adhesive of approximately 5 g/m² is used for affixing the corrugated medium and the liner. The fire retardancy of this double faced paperboard was flameproof 1 grade of JIS A 1322 test and V-0 class in UL-94 thin material vertical combustion test.

Next, this paperboard is cut into four (4) sheet materials of 60 cm×201 cm, short sides of two of them are joined respectively with a paper tape, to make two (2) wedge form assemblies of 30 cm×60 cm bottom side×2 m height. These two wedge form assemblies are fixed in parallel on an aluminum plate of 60 cm in length×60 cm in width×1 mm in thickness, to obtain a wedge form radio wave absorber of 60 cm×60 cm bottom side×about 2 m height.

In the manufacturing process of the aforementioned radio wave absorber, no distortion or the like has occurred in the assembly, and it could be assemble as a radio wave absorber presenting an excellent form-retaining property. In addition, the radio wave-absorbing property of thus obtained radio wave absorber was measured, to obtain an excellent radio wave-absorbing ability of −20 dB to −30 dB in a frequency range of 30 MHz to 300 MHz.

It should be appreciated that the radio wave-absorbing ability of this time was determined from the difference between a reflection level by measuring the reflection of the time when radio wave is applied vertically to an aluminum plate of 60 cm in length×60 cm in width×1 mm in thickness, and that obtained when radio wave is applied similarly to the radio wave absorber of the same area.

Embodiment 5

A paperboard same as the one manufactured in the embodiment 4 is cut into four (4) sheet materials of 60 cm×101 cm, short sides of two of them are joined respectively with a paper tape, to make two (2) wedge form assemblies of 30 cm×60 cm bottom side×1 m height. These two wedge form assemblies are fixed in a way to arrange on a sintered ferrite plate of 60 cm in length×60 cm in width×5.7 mm in thickness, and an aluminum plate of 60 cm in length×60 cm in width×1 mm in thickness is affixed to the back of the sintered ferrite plate, to obtain a wedge form radio wave absorber of 60 cm×60 cm bottom side×about 1 m height.

In the manufacturing process of the aforementioned radio wave absorber, no distortion or the like has occurred in the assembly, and it could be assembled as a radio wave absorber presenting an excellent form-retaining property.

The absorbing ability of this radio wave absorber was measured, to obtain −20 dB to −30 dB in 30 MHz to 300 MHz, −20 dB to −25 dB in 300 MHz to 1 GHz, and −20 dB to −30 dB in 1 GHz to 18 GHz, confirming the possibility to obtain an excellent absorbing ability not only in the frequency band of the anechoic chamber for EMC, 30 MHz to 1 GHz, but also in the microwave band.

Embodiment 6

Carbon fiber having sizing agent content rate of 0% and average fiber length of 6 mm chopped glass fiber, aramid pulp and aluminum hydroxide are mixed in a ratio of 0.8 wt %, 50 wt %, 9.2 wt % and 40 wt % respectively and submitted to the wet paper-making method to obtain an incombustible sheet E including electrical-loss material of 0.15 mm thick, 100 g/m$^2$ basis weight. On the other hand, chopped glass fiber, aramid pulp and aluminum hydroxide are mixed in a ratio of 50 wt %, 10 wt % and 40 wt % respectively and submitted to the wet paper-making method to obtain a sheet F not including electrical-loss material of 0.15 mm thick, 100 g/m$^2$.

Thus obtained sheet E is used for the corrugated medium, the sheet F is used for the liner and the corrugated medium is corrugated to manufacture a double faced paperboard of 1.2 mm in height, 1.3 times in take up ratio and 3 mm in interval between adjacent crests. The adhesive as the embodiment 1 is used for affixing the corrugated medium and the liner. The fire retardancy of the paperboard was flameproof 1 grade and V-0 class similarly to the embodiment 1.

The aforementioned paperboard is cut to have embossed folds, insert flaps and insert slits as shown in FIG. 5 (A), (B) to work out two (2) sheet materials for assembly. Four (4) wedge form assemblies of 45 cm height, 30 cm×30 cm bottom side respectively as shown in FIG. 6 were made from these two (2) sheet materials for assembly. These four (4) wedge form assemblies are fixed to a sintered ferrite plate same as the embodiment 2 so that corrugated ridge line directions of wedges of adjacent edges cross each other, and an aluminum plate same as the embodiment 2 is affixed to the back thereof, to obtain a wedge form radio wave absorber of 60 cm×60 cm bottom side×about 45 cm height.

In the manufacturing process of the aforementioned radio wave absorber, no distortion or the like has occurred in the assembly, and it could be assembled as a radio wave absorber presenting an excellent form-retaining property. In addition, the radio wave-absorbing property of thus obtained radio wave absorber was measured, to obtain an excellent radio wave-absorbing ability of −20 dB to −30 dB in a frequency range of 30 MHz to 300 MHz.

Embodiment 7

The sheet F not including an electrical-loss material manufactured in the embodiment 6 is used for the liner of one side and the corrugated medium, while the sheet E including an electrical-loss material is used for the liner of the other side, to manufacture a double faced paperboard, similarly to the embodiment 6.

The aforementioned paperboard is cut as shown in FIG. 5 (A), (B) to make four (4) wedge form assemblies of 45 cm height, 30 cm×30 cm bottom side respectively as shown in FIG. 6. These four (4) wedge form assemblies are fixed to a sintered ferrite plate same as the embodiment 4, similarly to the embodiment 6 and an aluminum plate is affixed, to obtain a wedge form radio wave absorber of 60 cm×60 cm bottom side×45 cm height.

In the manufacturing process of the aforementioned radio wave absorber, no distortion or the like has occurred in the assembly, and it could be assembled as a radio wave absorber presenting an excellent form-retaining property. In addition, the radio wave-absorbing property of thus obtained radio wave absorber was measured, to obtain an excellent radio wave-absorbing ability of −10 dB to −20 dB in a frequency range of 30 MHz to 300 MHz.

Embodiment 8

Carbon fiber having sizing agent of 0% and average fiber length of 6 mm, chopped glass fiber, aramid pulp and aluminum hydroxide are mixed in a ratio of 0.2 wt %, 50 wt %, 9.8 wt % and 40 wt % respectively and submitted to the wet paper-making method to obtain a sheet G including an electrical-loss material of 0.15 mm in thick, 100 g/m$^2$ in basis weight.

The aforementioned sheet G and sheet E are used for the inner liner respectively by one layer and the sheet F is used for the other liners and the corrugated medium to manufacture a triple wall of 2.5 mm in layer height, 1.5 times in take up ratio of the corrugated medium and 5 mm in interval between adjacent crests of the corrugated medium. The fire retardancy of the triple wall was flameproof 1 grade and V-0 class similarly to the embodiment 1. This triple wall is cut by 30 cm square and fitted to a reflector, while the sheet E layer side directs to the reflector side, to form as pedestal.

On the other hand, the sheet F is used for the corrugated medium and the liner of one side, while the sheet G is used for the liner of the other side, the corrugated medium is corrugated to manufacture a double faced paperboard of 1.2 mm in layer height, 1.3 times in take up ratio and 3 mm in interval between adjacent crests. The fire retardancy of this double faced paperboard was flameproof 1 grade and V-0 class, similarly to the embodiment 1. This double faced paperboard is cut into 8 pieces of 15 cm×11 cm, folded and arranged on the aforementioned pedestal, while the sheet G side directs to the reflector side as shown in FIG. 8, to form as radio wave absorber body. The radio wave-absorbing property of this radio wave absorber was measured in a microwave band of 2 to 18 GHz, to obtain an excellent radio wave-absorbing ability of −20 dB to −30 dB.

Embodiment 9

The assembly sheet for a radio wave absorber of 2.5 mm in layer height manufacture in the embodiment 4 is assembled as radio wave absorber by making the printed surface as radio wave incident face and fitting the other face to a reflector. The radio wave-absorbing property of this radio wave absorber was measured to obtain −15 dB to −20 dB in a milliwave band of 75 GHz to 110 GHz. It was confirmed that the assembly sheet for a radio wave absorber of the present invention functions as radio wave absorber in the milliwave band.

Embodiment 10

Figure 18:
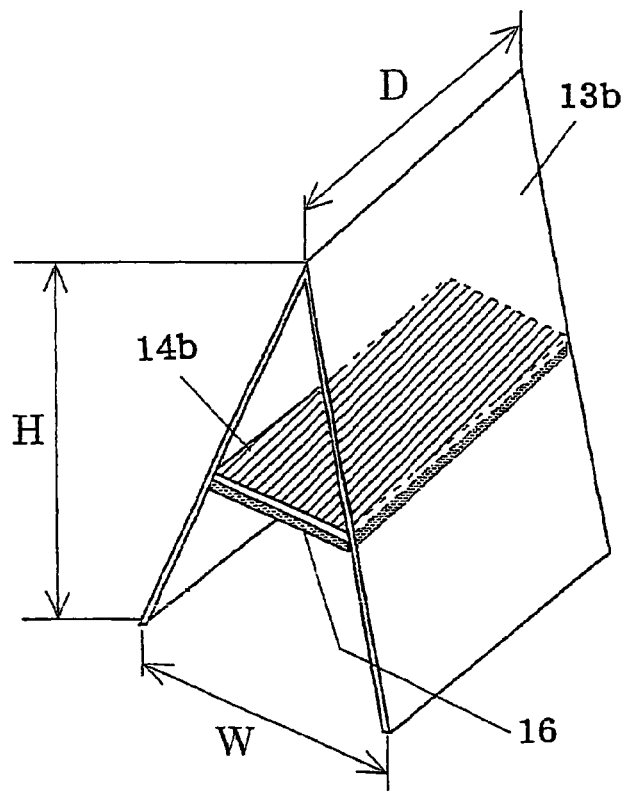
FIG. 18 shows another embodiment of the radio wave absorber of a wedge shape according to an embodiment of the present invention.

A hollow three-dimensional structure body of a wedge shape is made experimentally and the inner radio wave absorber of the aforementioned first embodiment is provided therein. A conductive thin member is obtained by impregnating with carbon powder of 0.6 g/m² in an incombustible paper of 1 mm in thickness. This is folded to shape into a wedge shape as shown in FIG. 18 to use as a hollow three-dimensional structure 13. In FIG. 18, the height (H), depth (D), and width (W) of the structure are 45 cm, 30 cm, and 30 cm, respectively. A conductive thin member of the same composition is molded into a rectangular shape of 15 cm in width and 30 cm in length to obtain an inner radio wave absorber 14.

The inner radio wave absorber 14 is mounted at a location where it is at a half of the height (H) from the bottom surface of the wedge. Incidentally, in this embodiment, for reinforcing the mechanical strength of the conductive thin member a reinforcing member 16 is adhered on the inner radio wave absorber. The reinforcing member 16 is made from a paperboard of the height of 2.5 mm which is used for packaging, and has almost no electroconductivity and is transparent as for radio waves. Therefore it does not affect any effect on radio waves given by the inner radio wave absorber 14.

Although it is not used in this embodiment, adhering a reinforcing member 16 to the hollow three-dimensional structure body increases the mechanical strength of the wedge shape. A mechanism for mounting the inner radio wave absorber 14 in the hollow three-dimensional structure body 13 may be arbitrarily adopted within a range that does not affect the radio wave-absorbing property. In this embodiment, adhesive is used for binding.

Four absorbing bodies of wedge shape shown in FIG. 18 are experimentally made to alternately arrange the ridge lines of their wedges to form one unit of radio wave absorber. It is known that a radio wave absorber of wedge shape has different radio wave absorption amount depending on whether the electric field vibration direction of incident radio wave is parallel or vertical to the ridge line of wedge. In an arrangement as shown in FIG. 19, average absorption amount of radio wave-absorption amounts of both directions is obtained and the effect of the directionality of the radio wave-absorbing property is eliminated.

Figure 19:
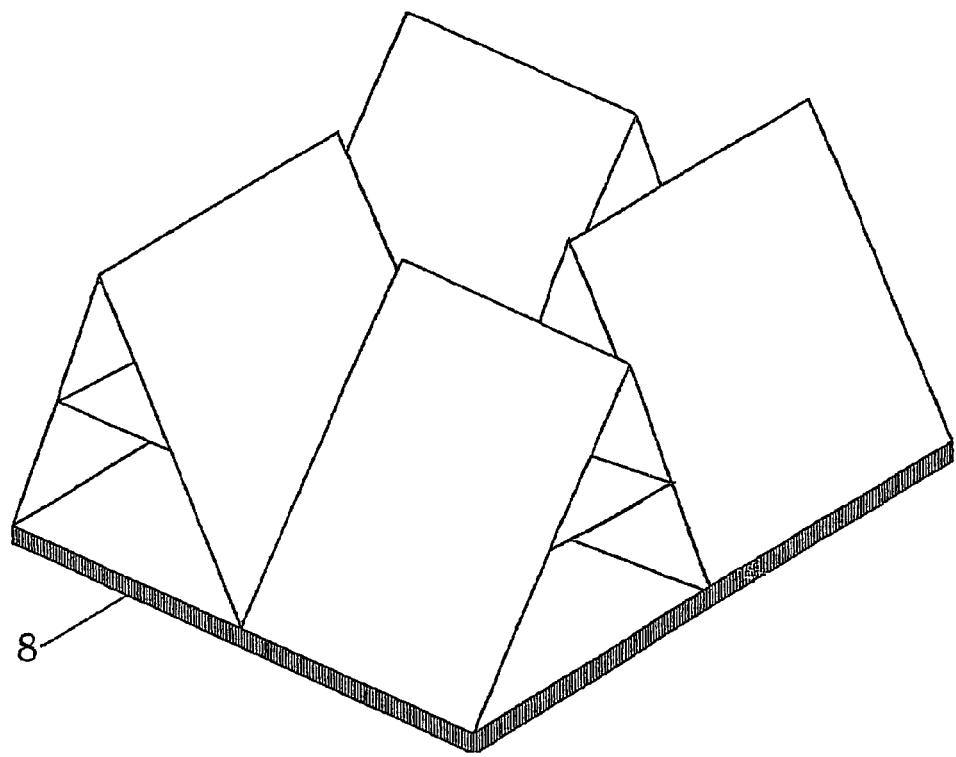
FIG. 19 shows one unit of a radio wave absorber composed by arranging four radio wave absorbers of a wedge shape shown in FIG. 18 so that the ridge lines of their wedge alternately cross.

The one unit of radio wave absorber shown in FIG. 19 is disposed on a ferrite tile absorber 8 to measure its radio wave-absorbing property in the frequency band of 30 MHz or more. It is said that the ferrite tile absorber 8 has a good radio wave-absorbing property in a range between 30 MHz and several hundreds MHz, however, the radio wave-absorbing property can be more improved mainly at 100 MHz or higher by arranging the one unit.

Figure 20:
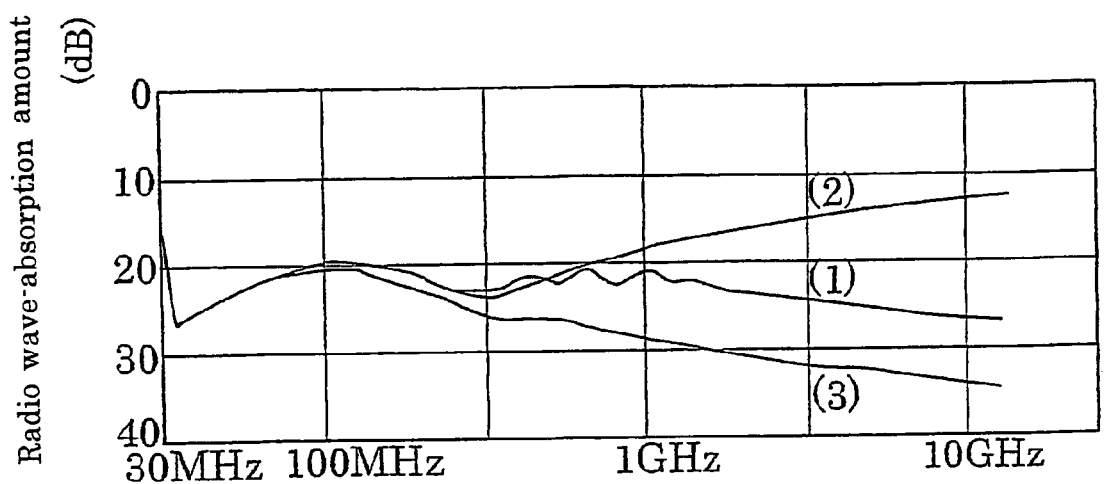
FIG. 20 shows an example of a radio wave absorbing property of the one unit shown in FIG. 19.

FIG. 20 shows a radio wave-absorbing property. In FIG. 20, (1), (2) and (3) respectively indicate a radio wave-absorbing property when using the unit of the aforementioned embodiment on the ferrite plate; a radio wave-absorbing property when using only a hollow three-dimensional structure 13 of the present invention; and a radio wave-absorbing property of an absorber formed into a wedge shape with the same size as that of the loss material of this embodiment using loss material obtained by impregnating a urethane foam material with carbon powder, that is, a wedge shaped radio wave absorber of which the whole volume is occupied with loss material.

Amount of impregnating carbon in (3) is 6 g/l (carbon powder of 6 g is impregnated in a 1 liter volume.)

In FIG. 20, (1), (2), and (3) show almost same radio wave-absorbing property in the range between 30 MHz and 300 MHz. This results from the fact that the radio wave-absorbing property in this frequency band is dominantly determined by the ferrite tile absorber 8.

However, when radio wave-absorption amount of several hundreds MHz or higher is noticed, the radio wave-absorption amount is larger in the order of (3)>(1)>(2). Since (1) and (2) are different on the point whether it has the inner radio wave absorber 14, that shows advantage of arranging an inner radio wave absorber.

INDUSTRIAL APPLICABILITY

A sheet material for a radio wave absorber of the present invention and a radio wave absorber thereof can be used for the walls, ceiling, floor and the like of an anechoic chamber, which is used for measurement testing the properties of antennae or radio-wave measurement testing an electronic device, in order to prevent any radio waves from being entered from outside and from radiating them externally.

In addition to the applications other than anechoic chamber related facilities, it can be used to create environment necessary to shield or absorb radio waves.

DESCRIPTION OF SYMBOLS

1 Sheet material for a radio wave absorber
2 Corrugated medium
3 Liner
4 Fold
5 Insert flap
6 Insert slit
7 Overlap width
8 Ferrite plate
9 Aluminum plate
10,20,30,40,50 Radio wave absorber
11 Outer shape reinforcing part
12 Pedestal
13 Hollow three-dimensional structure body
14 Inner radio wave absorber
15 Notch part
16 Reinforcing member

What is claimed is:

1. A sheet material for a radio wave absorber comprising a paperboard structure in which a corrugated medium and a planar liner are layered over each other, wherein the corrugated medium and/or the liner are constructed from a sheet including an electroconductive fiber, the amount of said electroconductive fiber in said sheet being 0.08 to 3 wt %; the thickness of the paperboard structure is 1 to 5 mm; the take up ratio of the corrugated medium to the liner of the paperboard structure is in a range of 1.2 to 2 times; and the interval between adjacent tops of the corrugated medium is in a rance of 1 to 15 mm.

2. The sheet material for a radio wave absorber of claim 1, wherein the sheet is mixed paper including the electroconductive fiber.

3. The sheet material for a radio wave absorber of claim 2, wherein a ratio (y/p) of maximum electric conductivity (p) of the mixed paper and electric conductivity (y) measured in a direction orthogonal to a measurement direction presenting the maximum electric conductivity (p) is in a range of 0.35 to 0.95.

4. The sheet material for a radio wave absorber of claim 1, wherein the paperboard structure is one selected from single faced paperboard, double faced paperboard, double wall paperboard and triple wall.

5. The sheet material for a radio wave absorber of claim 2, wherein the electroconductive fiber is a carbon fiber and an average fiber length of the carbon fiber is 1 to 60 mm.

6. The sheet material for a radio wave absorber of claim 5, wherein a content of sizing agent adhered to the carbon fiber is not more than 0.9 wt % of total carbon fiber weight.

7. The sheet material for a radio wave absorber of claim 1, wherein at least one selected from the group consisting of printing of colors, patterns or letters, and embossing of patterns or letters is applied to an outside surface of the liner.

8. A radio wave absorber, wherein the sheet material for a radio wave absorber of claim 1 is cut, folded, and assembled into a hollow three-dimensional structure body, which has a shape of wedge, polygonal pyramid, or polygonal cylinder.

9. A radio wave absorber, wherein, inside of the hollow three-dimensional structure body of claim 8, one or more of a sheet material for a radio wave absorber comprising a paperboard structure in which a corrugated medium and a planar liner are layered over each other, wherein the corrugated medium and/or the liner are constructed from a sheet including an electrical-loss material, is arranged parallel to a bottom surface of the radio wave absorber.

10. A radio wave absorber of which the hollow three-dimensional structure body of claim 8 has a pyramidal form, wherein a sheet material for a radio wave absorber comprising a paperboard structure in which a corrugated medium and a planar liner are layered over each other, wherein the corrugated medium and/or the liner are constructed from a sheet including an electrical-loss material, is formed into an isosceles triangle plate two sides of which are along an inner wall of the radio wave absorber to match with each other at a right angle, and the other side of which is arranged perpendicularly to the bottom surface of the radio wave absorber.

11. A radio wave absorber of which the hollow three-dimensional structure body of claim 8 has a wedge form, wherein, inside of the radio wave absorber, a sheet material for a radio wave absorber comprising a paperboard structure in which a corrugated medium and a planar liner are layered over each other, wherein the corrugated medium and/or the liner are constructed from a sheet including an electrical-loss material, is formed into an isosceles triangle plate two sides of which are along an inner wall of the radio wave absorber to arrange one or more plates perpendicularly to a ridge line of wedge.

12. The radio wave absorber of claim 8, wherein a sheet material for a radio wave absorber comprising a paperboard structure in which a corrugated medium and a planar liner are layered over each other, wherein the corrugated medium and/or the liner are constructed from a sheet including an electrical-loss material, has paired insert slits and insert flaps, and the hollow three-dimensional structure body is assembled by inserting the insert flap into the insert slits not to deform the shape.

13. The radio wave absorber of claim 8, wherein the hollow three-dimensional structure body is erected on a sintered ferrite plate.

14. The radio wave absorber of claim 8, wherein the hollow three-dimensional structure body is erected on a pedestal where a sheet material for a radio wave absorber comprising a paperboard structure in which a corrugated medium and a planar liner are layered over each other, wherein the corrugated medium and/or the liner are constructed from a sheet including an electrical-loss material, is layered over in one or more layers.

15. The radio wave absorber of claim 8, wherein the pedestal is formed by layering on a reflective flat plate one or more sheet material layers for a sheet material for a radio wave absorber comprising a paperboard structure in which a corrugated medium and a planar liner are layered over each other, wherein the corrugated medium and/or the liner are constructed from a sheet including an electrical-loss material, where at least the corrugated medium is formed from a sheet including the electrical-loss material, and the hollow three-dimensional structure body is erected on the pedestal.

16. The radio wave absorber of claim 14, wherein two or more layers of the sheet material for a radio wave absorber are layered over so that a corrugated row direction of the corrugated medium crosses each other among the layers.

\* \* \* \* \*